United States Patent
Lee et al.

(10) Patent No.: US 8,129,322 B2
(45) Date of Patent: Mar. 6, 2012

(54) PHOTOSENSITIVE-RESIN REMOVER COMPOSITION AND METHOD OF FABRICATING SEMICONDUCTOR DEVICE USING THE SAME

(75) Inventors: Ahn-Ho Lee, Suwon-si (KR); Junghun Lim, Daejeon (KR); Young Taek Hong, Yonin-si (KR); Hyuntak Kim, Suwon-si (KR); Seonghwan Park, Cheongju-si (KR); Baiksoon Choi, Anyang-si (KR); Seunghyun Ahn, Suwon-si (KR); Byungil Lee, Gwangju-si (KR)

(73) Assignees: Samsung Electronics Co., Ltd., Suwon-si, Gyeonggi-do (KR); Techno Semichem Co., Ltd., Seongnam-si, Gyeonggi-do (KR)

( * ) Notice: Subject to any disclaimer, the term of this patent is extended or adjusted under 35 U.S.C. 154(b) by 0 days.

(21) Appl. No.: 13/039,501

(22) Filed: Mar. 3, 2011

(65) Prior Publication Data

US 2011/0218134 A1   Sep. 8, 2011

(30) Foreign Application Priority Data

Mar. 4, 2010   (KR) .................. 10-2010-0019538

(51) Int. Cl.
*G03F 7/42*   (2006.01)
(52) U.S. Cl. ...................... 510/175; 510/176
(58) Field of Classification Search .......... 510/175, 510/176; 252/79.1
See application file for complete search history.

(56) References Cited

U.S. PATENT DOCUMENTS

| | | | | |
|---|---|---|---|---|
| 6,534,459 B1 * | 3/2003 | Yata et al. | ...... | 510/176 |
| 6,599,370 B2 * | 7/2003 | Skee | ...... | 134/3 |
| 6,656,895 B2 * | 12/2003 | Ichiki | ...... | 510/175 |
| 7,049,275 B2 * | 5/2006 | Ikemoto et al. | ...... | 510/176 |
| 7,078,371 B2 * | 7/2006 | Ikemoto | ...... | 510/176 |
| 7,144,848 B2 * | 12/2006 | Zhou et al. | ...... | 510/175 |
| 7,250,391 B2 * | 7/2007 | Kanno et al. | ...... | 510/175 |
| 7,456,140 B2 * | 11/2008 | Small et al. | ...... | 510/175 |
| 7,572,758 B2 * | 8/2009 | Shimada et al. | ...... | 510/175 |
| 7,671,001 B2 * | 3/2010 | Skee | ...... | 510/175 |
| 7,947,637 B2 * | 5/2011 | Kneer | ...... | 510/175 |
| 2002/0077259 A1 * | 6/2002 | Skee | ...... | 510/175 |
| 2002/0130298 A1 * | 9/2002 | Ichiki | ...... | 252/79.1 |
| 2003/0171239 A1 * | 9/2003 | Patel et al. | ...... | 510/406 |
| 2003/0181344 A1 * | 9/2003 | Ikemoto et al. | ...... | 510/175 |
| 2003/0186175 A1 * | 10/2003 | Ikemoto et al. | ...... | 430/331 |
| 2004/0038840 A1 * | 2/2004 | Lee et al. | ...... | 510/202 |
| 2004/0048761 A1 * | 3/2004 | Ikemoto | ...... | 510/175 |
| 2004/0081922 A1 * | 4/2004 | Ikemoto et al. | ...... | 430/329 |
| 2004/0106531 A1 * | 6/2004 | Kanno et al. | ...... | 510/175 |
| 2004/0134873 A1 * | 7/2004 | Yao et al. | ...... | 216/2 |
| 2004/0137379 A1 * | 7/2004 | Ikemoto | ...... | 430/331 |
| 2004/0147420 A1 * | 7/2004 | Zhou et al. | ...... | 510/176 |
| 2005/0187118 A1 * | 8/2005 | Haraguchi et al. | ...... | 510/175 |
| 2005/0202987 A1 * | 9/2005 | Small et al. | ...... | 510/175 |

(Continued)

FOREIGN PATENT DOCUMENTS

JP   2002-196509   7/2002

(Continued)

*Primary Examiner* — Gregory Webb
(74) *Attorney, Agent, or Firm* — Lee & Morse, P.C.

(57) ABSTRACT

A photosensitive-resin remover composition includes an amine compound and de-ionized water, an amount of the de-ionized water being about 45% to about 99% by weight based on a total weight of the composition.

3 Claims, 8 Drawing Sheets

U.S. PATENT DOCUMENTS

| | | | |
|---|---|---|---|
| 2005/0209117 A1* | 9/2005 | Friedrich et al. | 510/175 |
| 2006/0040838 A1* | 2/2006 | Shimada et al. | 510/175 |
| 2006/0189141 A1* | 8/2006 | Mahlkow et al. | 438/694 |
| 2006/0270574 A1* | 11/2006 | Ikemoto | 510/176 |
| 2007/0060490 A1* | 3/2007 | Skee | 510/175 |
| 2007/0179072 A1* | 8/2007 | Rao et al. | 510/175 |
| 2008/0004197 A1* | 1/2008 | Kneer | 510/245 |
| 2008/0139436 A1* | 6/2008 | Reid | 510/176 |
| 2009/0107520 A1* | 4/2009 | Lee et al. | 134/2 |
| 2009/0130849 A1* | 5/2009 | Lee | 438/693 |
| 2009/0133716 A1* | 5/2009 | Lee | 134/3 |
| 2009/0137191 A1* | 5/2009 | Lee | 451/36 |
| 2010/0043823 A1* | 2/2010 | Lee | 134/1.3 |
| 2010/0056410 A1* | 3/2010 | Visintin et al. | 510/176 |
| 2010/0105594 A1* | 4/2010 | Lee et al. | 510/176 |
| 2010/0105595 A1* | 4/2010 | Lee | 510/176 |
| 2010/0152086 A1* | 6/2010 | Wu et al. | 510/175 |
| 2010/0255429 A1* | 10/2010 | Ishikawa et al. | 430/324 |
| 2010/0294306 A1* | 11/2010 | Mochizuki et al. | 134/1.3 |

FOREIGN PATENT DOCUMENTS

| | | |
|---|---|---|
| JP | 2003-156859 | 5/2003 |
| JP | 2009-505132 | 5/2009 |
| KR | 10-2003-0025521 A | 3/2003 |
| KR | 10-2008-0012424 A | 2/2008 |
| KR | 10-2008-0045501 A | 5/2008 |
| WO | WO-2007/021085 A1 | 2/2007 |

* cited by examiner

CORROSION

PHOTOSENSITIVE-RESIN REMOVER COMPOSITION AND METHOD OF FABRICATING SEMICONDUCTOR DEVICE USING THE SAME

CROSS-REFERENCE TO RELATED APPLICATIONS

Korean Patent Application No. 10-2010-0019538, filed on Mar. 4, 2010, in the Korean Intellectual Property Office, and entitled: "Photosensitive-Resin Remover Composition and Method of Fabricating Semiconductor Device Using the Same," is incorporated by reference herein in its entirety.

BACKGROUND

1. Field

The present disclosure herein relates to a photosensitive-resin remover composition and a method of fabricating a semiconductor device using the same.

2. Description of the Related Art

The photo-resist pattern that includes photosensitive resin during the process of fabricating a semiconductor device may be used as a variety of masks in etching, ion implantation, and plating processes. It is required that the photo-resist pattern have excellent adhesion to a lower layer and be chemically stable against an etchant, a plating solution, etc. For precise patterning in the etching process or reduction of time in the plating process, the mechanical strength of the photo-resist pattern may be increased. After the etching, ion implantation, and plating processes are performed using the photo-resist pattern, a process of removing the photo-resist pattern is required.

SUMMARY

Embodiments are therefore directed to a photosensitive-resin remover composition and a method of fabricating a semiconductor device using the same, which substantially overcome one or more of the problems due to the limitations and disadvantages of the related art.

It is therefore a feature of an embodiment to provide a photosensitive-resin remover composition by which a photosensitive resin may be easily removed without corrosion of metal patterns.

It is therefore another feature of an embodiment to provide a photosensitive-resin remover composition by which photosensitive resin byproducts degenerated in the etching process may be cleanly removed.

It is yet another feature of an embodiment to provide a method of fabricating a semiconductor device, which is reliable and may enhance productivity.

At least one of the above and other features and advantages may be realized by providing a photosensitive-resin remover composition, including an amine compound and de-ionized water, an amount of the de-ionized water being about 45% to about 99% by weight based on a total weight of the composition.

A structure of the amine compound may be represented by one of Formulae 1 to 3,

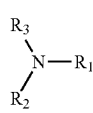

Formula 1

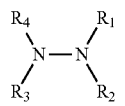

Formula 2

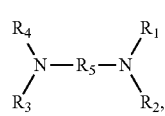

Formula 3 wherein each of $R_1$, $R_2$, $R_3$, and $R_4$ in Formulas 1 to 3 is independently hydrogen, a $C_{1-4}$ alkyl group, a $C_{1-4}$ alkoxy group, or a hydroxy group, with the proviso that $R_1$, $R_2$, and $R_3$ in Formula 1 are not simultaneously hydrogen, and wherein $R_5$ in Formula 3 is a $C_{1-4}$ alkylene. The amine compound may have an oxidation reduction potential of about 0 or less. The photosensitive-resin remover composition may further include a removing accelerator in an amount of about 0.01% to about 10% by weight based on a total weight of the composition.

A structure of the removing accelerator may be represented by Formula 4,

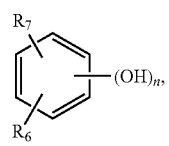

Formula 4 wherein n is an integer of 1 to 4, and each of $R_6$ and $R_7$ is independently hydrogen, a carboxylic group, a $C_{1-4}$ alkoxy group, a $C_{1-4}$ alkyl group, or a $C_{1-4}$ alkyl alcohol group. The photosensitive-resin remover composition may further include a corrosion inhibitor, the corrosion inhibitor being at least one of an aromatic mercapto compound, an organic compound, and an anhydride including a carboxylic group, a triazole compound, an ammonium salt, and/or a polysaccharide. The photosensitive-resin remover composition may further include an organic solvent having an oxidation reduction potential value of about 0 or more. The organic solvent may be butyl diglycol. The viscosity of the photosensitive-resin remover composition may have viscosity of about 1 centipoises to about 2 centipoises.

At least one of the above and other features and advantages may be realized by providing a photosensitive-resin remover composition, including a hydrazine hydrate in an amount of about 1% to about 3% by weight, a removing accelerator in an amount of about 1% to about 3% by weight, butyl diglycol in an amount of about 10% to about 40% by weight, and de-ionized water in an amount of about 70% to about 88% by weight, wherein a structure of the removing accelerator is represented by Formula 4

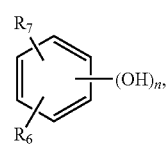

wherein n is an integer of 3 or 4, and each of $R_6$ and $R_7$ is independently hydrogen, a carboxylic group, a $C_{1-4}$ alkoxy group, a $C_{1-4}$ alkyl group, or a $C_{1-4}$ alkyl alcohol group. The removing accelerator may have an oxidation reduction potential value of less than about (−400) mV.

At least one of the above and other features and advantages may be realized by providing a method for fabricating a semiconductor device, the method including forming a photosensitive resin pattern on a wafer, and removing the photosensitive resin pattern by using a photosensitive-resin remover composition, the photosensitive-resin remover composition being formed to include an amine compound and de-ionized water, the de-ionized water being in an amount of about 45% to about 99% by weight based on a total weight of the photosensitive-resin remover composition. Using the photosensitive-resin remover composition may include adjusting the amount of de-ionized water to impart a viscosity of about 1 centipoise to about 2 centipoises to the photosensitive-resin remover composition.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1A:
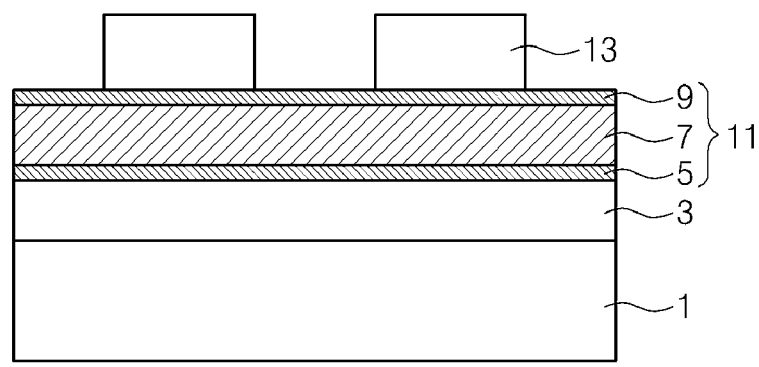
FIGS. 1A through 1D illustrate process cross-sectional views of sequential steps in a method of fabricating a semiconductor device according to an embodiment of the inventive concept.

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

In the drawings, the dimensions of layers and regions may be exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

FIGS. 1A through 1D illustrate process cross-sectional views of a method of fabricating a semiconductor device according to an embodiment of the inventive concept.

Referring to FIG. 1A, an insulation layer 3 may be stacked on a semiconductor substrate 1, and a first diffusion barrier 5, a metal layer 7, and a second diffusion barrier 9 may be sequentially formed on the insulation layer 3. The insulation layer 3 may be, e.g., a silicon oxide layer. The first and second diffusion barriers 5 and 9 may be, e.g., a titanium/titanium nitride layer. The metal layer 7 may be, e.g., an aluminum layer. The first and second diffusion barrier layers 5 and 9 and the metal layer 7 may form an interconnection layer 11. A photosensitive resin pattern, i.e., a photo-resist pattern 13, may be formed on the second diffusion barrier 9 by a photolithography process. The photo-resist pattern 13 may define the form of gate electrodes or interconnections.

Figure 1B:
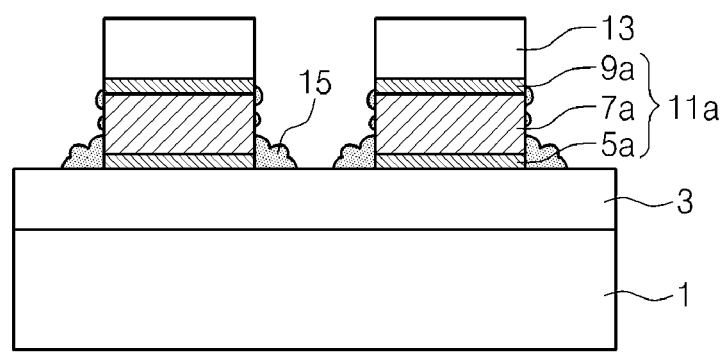

Referring to FIG. 1B, the interconnection layer 11 may be etched by using the photo-resist pattern 13 as an etch mask to fowl an interconnection pattern 11a including a first diffusion barrier pattern 5a, a metal pattern 7a, and a second diffusion barrier pattern 9a. For example, when the metal layer 7 is an aluminum layer, carbon tetrachloride and oxygen may be supplied to perform an etching process. Byproducts 15 resulting from the etching process may be formed between the interconnection patterns 11a.

Figure 1C:
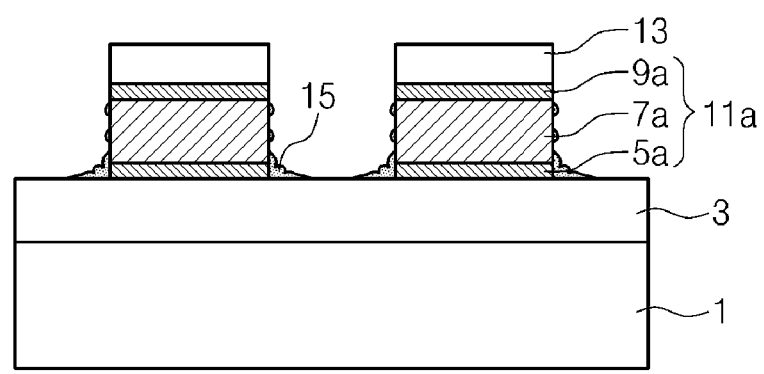

Referring to FIG. 1C, oxygen and nitrogen may be supplied to perform an ashing process. Although a substantial amount of the byproducts 15 is removed by the ashing process, some byproducts 15 of photosensitive resin film may still be present as a residue between the interconnection patterns 11a. The byproducts 15 may be a polymer in which aluminum-carbon-oxide, aluminum-oxide, and carbon-oxide are combined with each other. Some of the photo-resist pattern 13 may be also removed by the ashing process, and the photo-resist pattern 13 may be degenerated or hardened.

Figure 1D:
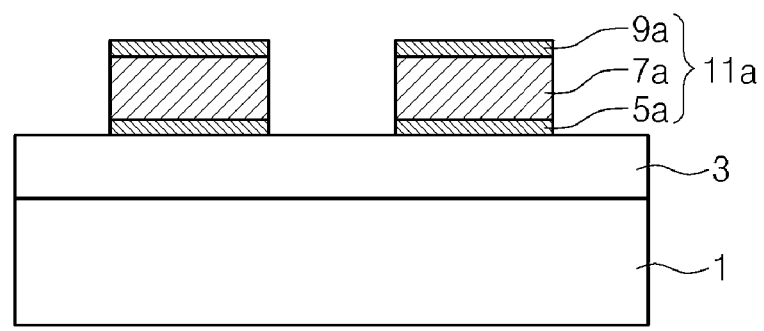

Referring to FIG. 1D, a photosensitive-resin remover composition according to the inventive concept may be used to remove the photo-resist patterns 13 and the byproducts 15 from the structure illustrated in FIG. 1C. The photosensitive-resin remover composition may include an amine compound and de-ionized water, wherein the de-ionized water is included in an amount of about 45% to about 99% by weight based on a total weight of the composition. The temperature of a process where the photosensitive-resin remover composition is applied to remove the photo-resist patterns 13 and the byproducts 15 from the structure illustrated in FIG. 1C may be about 25° C. to about 70° C. When the process temperature is lower than about 25° C., a function of the photosensitive-resin remover composition according to example embodiments may be deteriorated, e.g., portions of the photo-resist patterns 13 and the byproducts 15 may remain or the time required for removing the photo-resist patterns 13 and the byproducts 15 may be too long. When the process temperature is about 70° C. or higher, corrosion of the metal pattern 7 may increase. Although the time to apply the photosensitive-resin remover composition, i.e., a length of time that the photosensitive-resin remover composition contacts the photo-resist pattern 13, depends on the thickness of the photo-resist pattern 13 to be removed and the degree of its degeneration, it may be about 1 minute to about 20 minutes.

Removal of the photo-resist pattern 13 and the byproducts 15, i.e., present as residue, with the photosensitive-resin remover composition may be performed in a batch-type manner or a single wafer manner. For example, the photo-resist pattern 13 and the byproducts 15 may be removed while a wafer shown in FIG. 1B is dipped in the photosensitive-resin remover composition, or they may be removed by dropping the photosensitive-resin remover composition onto the wafer while rotating the wafer. This is possible because the content of the de-ionized water in the photosensitive-resin remover composition according to an embodiment of the inventive concept is about 45% to about 99% by weight based on a total weight of the composition, and the viscosity of the photosensitive-resin remover composition is about 1 centipoises to about 2 centipoises.

For example, the amine compound in the photosensitive-resin remover composition may have one structure of the following Formulae 1 to 3.

Formula 1

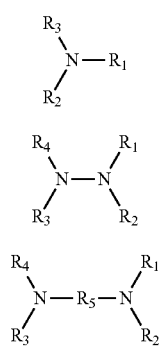

Formula 2

Formula 3

In Formulae 1 to 3, each of $R_1$, $R_2$, $R_3$, and $R_4$ may be hydrogen, a $C_{1-4}$ alkyl group, a $C_{1-4}$ alkoxy group, or a hydroxy group. It is noted, however, that $R_1$, $R_2$, and $R_3$ in Formula 1 are not simultaneously be hydrogen. In Formula 3, $R_5$ may be a $C_{1-4}$ alkylene.

The amine compound may have an oxidation reduction potential value of about 0 or less. For example, the amine compound may have an oxidation reduction potential value lower than about (−400) mV, e.g., about (−930) mV or lower, so that the power to remove byproducts formed of aluminum-oxide and/or carbon-oxide is excellent.

Preferably, the photosensitive-resin remover composition may further include a removing accelerator. The removing accelerator may be included in an amount of about 0.01% to about 15% by weight, e.g., about 0.01% to about 10% by weight, based on a total weight of the photosensitive-resin remover composition.

For example, the removing accelerator may have the structure of Formula 4 below.

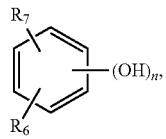

Formula 4

In Formula 4, n is an integer of 1 to 4, and each of $R_6$ and $R_7$ may be hydrogen, a carboxylic group, a $C_{1-4}$ alkoxy group, a $C_{1-4}$ alkyl group, or a $C_{1-4}$ alkyl alcohol. In implementation, a structure when each of $R_6$ and $R_7$ is hydrogen and n is 2 may not be included as a remover accelerator in the photosensitive-resin remover composition of an embodiment of the inventive concept.

The removing accelerator activates the amine compound in the photosensitive-resin remover composition of an embodiment of the inventive concept when removing a photosensitive resin. Therefore, the removing accelerator may serve as an activator for removing a hardened or degenerated photosensitive resin more actively, e.g., as compared to related art, and may simultaneously serve as a corrosion inhibitor by inhibiting the corrosion of the metal interconnection.

For example, in Formula 4, n may be 3 or 4. A removing accelerator with n of 3 or 4 may exhibit a significantly enhanced removal power, e.g., as compared to related art, thereby reducing a reaction time (or time to perform a photo-resist removal process) and facilitating the reaction, i.e., performance of photosensitive-resin removal process, under low temperatures. Thus, it may also be applicable to a single-wafer process.

For example, the removing accelerator may include a compound with any one of the following structures.

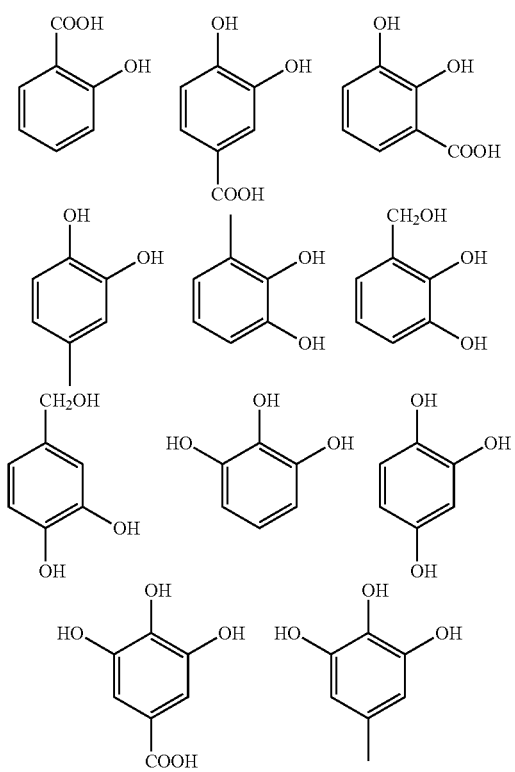

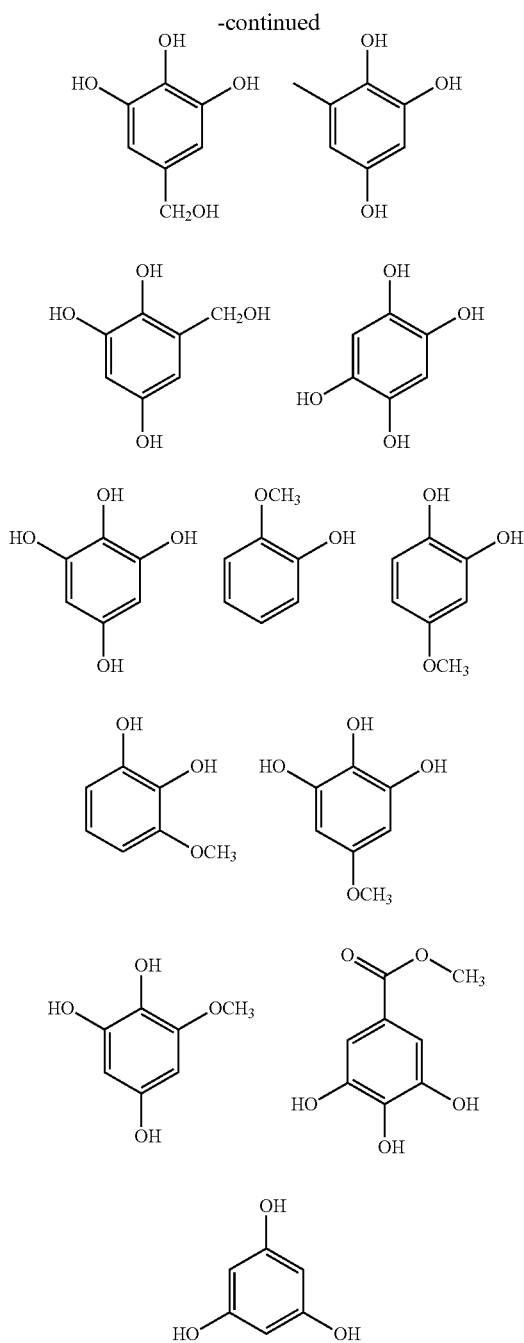

The photosensitive-resin remover composition may further include a corrosion inhibitor. The corrosion inhibitor may be at least one of an aromatic mercapto compound, an organic compound, or an anhydride including a carboxylic group, a triazole compound, an ammonium salt, and/or a polysaccharide.

The photosensitive-resin remover composition may further include an organic solvent having an oxidation reduction potential value of 0 or higher. For example, the organic solvent may be butyl diglycol. The organic solvent may be included in an amount of about 10% to about 40% by weight based on the photosensitive-resin remover composition.

The amine compound may be included in the photosensitive-resin remover composition in an amount of about 1% to about 40% by weight. When the amount of the amine compound is lower than about 1% by weight, it may be difficult to completely remove a photosensitive resin film with a side wall degenerated by hard bake, dry etching, ashing process, etc. When the amount of the amine compound is higher than about 40% by weight, there may be no difference in removal power accompanied by the increase in the amine compound, thereby reducing economic and environmental desirability. When the content of the amine compound in the photosensitive-resin remover composition is about 60% by weight or higher, the removal power may be decreased.

FIGS. 2A through 2D illustrate process cross-sectional views of a method of fabricating a semiconductor device according to another embodiment of the inventive concept.

Figure 2A:
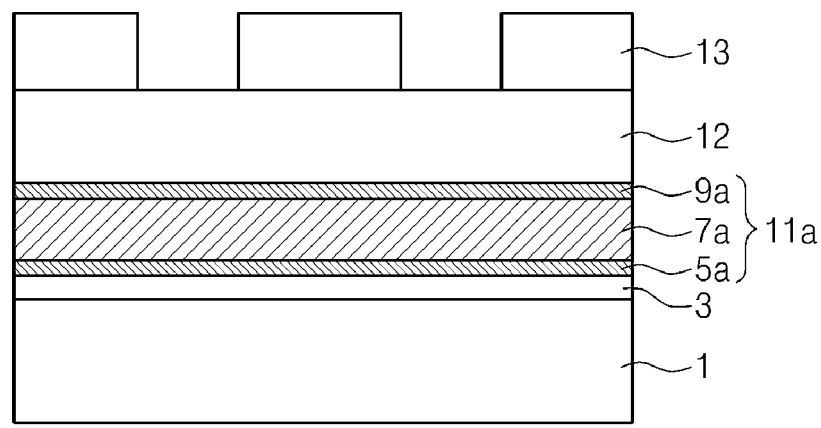
FIGS. 2A through 2D illustrate process cross-sectional views of sequential steps in a method of fabricating a semiconductor device according to another embodiment of the inventive concept.

Referring to FIG. 2A, the insulation layer 3 may be stacked on the semiconductor substrate 1, and the interconnection pattern 11a including the first diffusion barrier pattern 5a, the metal pattern 7a, and the second diffusion barrier pattern 9a may be formed on the insulation layer 3. An interlayer dielectric 12 may be formed on the interconnection pattern 11a. The interlayer dielectric 12 may be, e.g., a silicon oxide layer. The photo-resist pattern 13 which defines via holes may be formed on the interlayer dielectric 12.

Figure 2B:
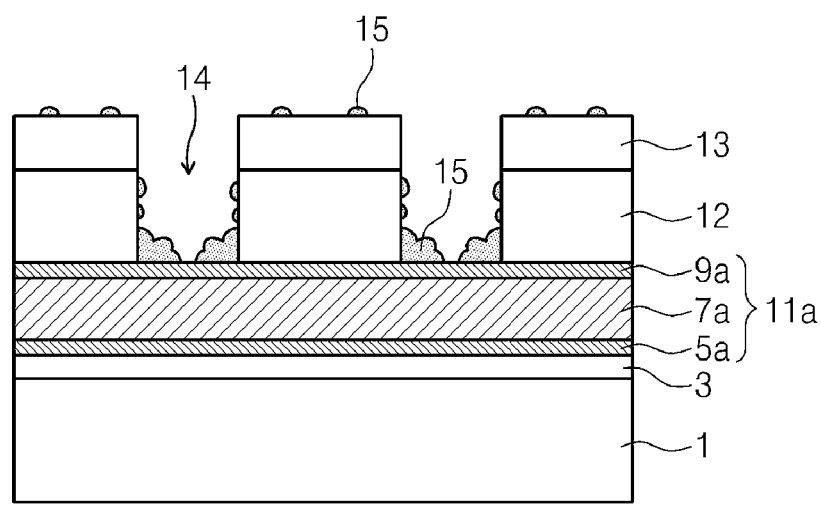

Referring to FIG. 2B, the interlayer dielectric 12 is etched by using the photo-resist pattern 13 as an etch mask and supplying carbon tetrafluoride ($CF_4$) and oxygen to form via holes 14 exposing the top surface of the interconnection pattern 11a. Byproducts 15 by the etching process may be formed in and out of the via holes 14.

Figure 2C:
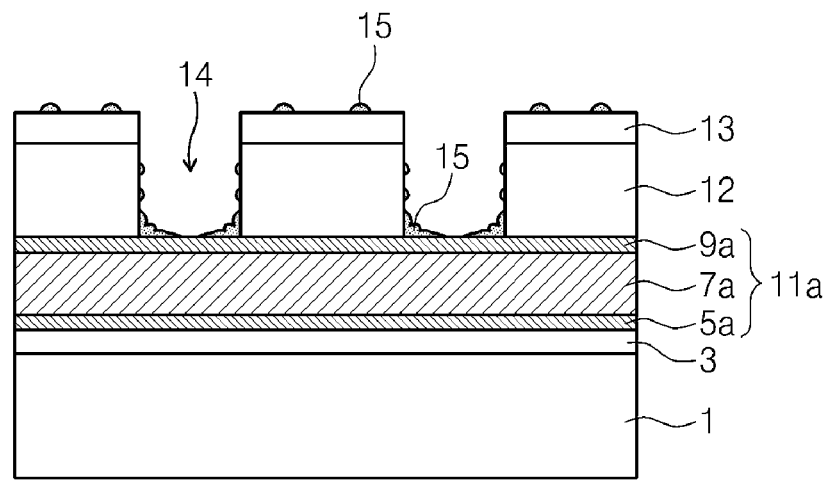

Referring to FIG. 2C, oxygen and nitrogen may be supplied to perform an ashing process. Although a substantial amount of the byproducts 15 may be removed by the ashing process, byproducts 15 of a photo-sensitive resin film may still be present as a residue in and out of the via holes 14. The byproducts 15 may be a polymer combined with aluminum-carbon-oxide, aluminum-oxide, and/or carbon-oxide. Some of the photo-resist pattern 13 may be also removed by the ashing process, and the photo-resist pattern 13 may be degenerated or hardened.

Figure 2D:
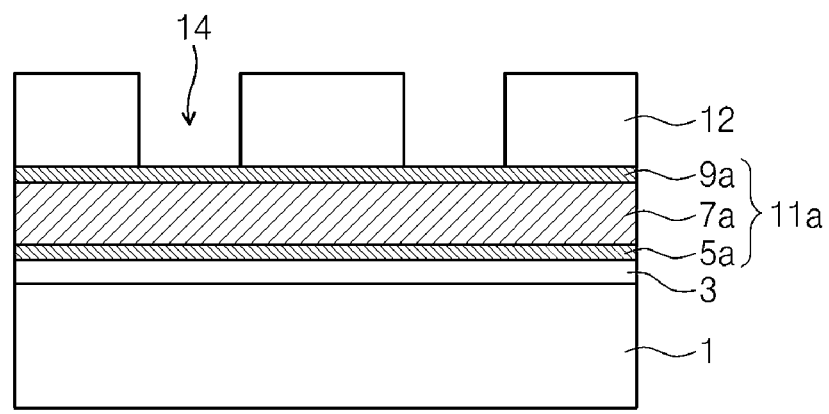

Referring to FIG. 2D, a photosensitive-resin remover composition according to an embodiment of the inventive concept may be used to remove the photo-resist pattern 13 and the byproducts 15. The photosensitive-resin remover composition may be the same as described previously with reference to the fabrication method in FIGS. 1A through 1D. The process temperature and treatment time in the step of FIG. 2D may be identical to those described previously with reference to FIG. 1D.

EXAMPLES

1. Preparation of Photosensitive-resin Remover Compositions 1 to 5 According to Experimental Examples of the Inventive Concept First, photosensitive-resin remover compositions 1 to 5 according to example embodiments were prepared to have the compositions in Table 1. Acronyms used in Table 1 are explained below.

TABLE 1

| | | Component (% by weight) | | | | | |
|---|---|---|---|---|---|---|---|
| | | Amine compound | | | Organic solvent | Removing accelerator | De-ionized water |
| Solution | Division | Hydrazine hydrate | Methyl amine | Diethyl amine | BDG | type and % by weight | |
| Solution 1 | Experimental Example 1 | 2.4 | | | | MG 1 | 96.6 |
| Solution 2 | Experimental Example 2 | 2.4 | | | | PA 2 | 95.6 |
| Solution 3 | Experimental Example 3 | | | 10 | | PG 2 | 88 |
| Solution 4 | Experimental Example 4 | 2.4 | | | 20 | PG 1.5 | 76.1 |
| Solution 5 | Experimental Example 5 | | 3 | | | MG 0.5 | 96.5 |

MG: Methyl Gallate, 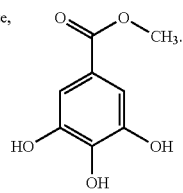

PA: Pyrogallic Acid [1,2,3-Benzenetriol], 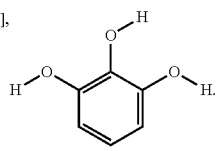

PG: Phloroglucin [1,3,5-Benzenetriol], 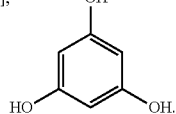

BDG: Butyl diglycol.

2. Preparation of Conventional Photosensitive-resin Remover Composition Solutions 6 and 7

Next, for comparison with compositions of the inventive concept, i.e., solutions 1-5, conventional photosensitive-resin remover composition solutions were prepared as in the following Table 2.

TABLE 2

| | | Component (% by weight) | | | | | | |
|---|---|---|---|---|---|---|---|---|
| | | Amine compound | | Removing accelerator/ Organic solvent | | | | |
| Solution | Division | Mono-ethanol amine | Hydroxyl amine | Organic solvent DMAc | Hydroxyl amine sulfate | N-methyl-morpholine-N-oxide | Removing accelerator Catechol | De-ionized water |
| Solution 6 | Comparative Example 1 | 7 | — | 34 | 14 | 8 | — | 37 |
| Solution 7 | Comparative Example 2 | 49.5 | 28.9 | — | — | — | 5 | 16.6 |

DMAc: Dimethyl acetamide 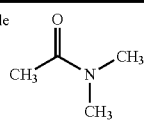

Comparing Table 1 with Table 2, BDG, i.e., butyldiglycol, used as an organic solvent in the Experimental Examples of the inventive concept, i.e., solutions 1-5, is less toxic and more environmentally friendly than DMAc, i.e., dimethyl acetamide, used in the Comparative Examples, i.e., solutions 6-7.

3. Preparation of Metal Interconnection Specimens

Figure 3A:
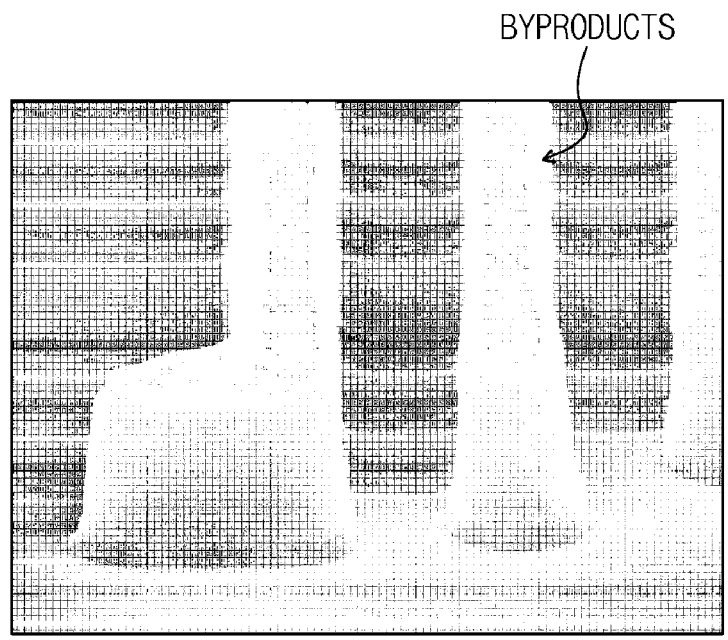
FIG. 3A illustrates an electron microscope photograph of etched metal patterns prior to treatment with a photosensitive-resin remover composition according to an embodiment of the inventive concept.

As described by referring to FIG. 1A, a silicon oxide layer was formed on a silicon wafer. Next, an interconnect layer, i.e., Ti/TiN 150 Å/Al 8000 Å/TiN 100 Å, was formed on the silicon oxide layer. A photolithography process was performed to form a photo-resist pattern. As described by referring to FIG. 1B, a mixture gas of $CCl_4/O_2$ was supplied as an etching gas and a lower interconnection layer which was not covered with the photo-resist pattern was etched to form a metal interconnection. As described by referring to FIG. 1C, a mixture gas of oxygen/nitrogen was supplied as a reaction gas to perform an ashing process. In this way, a metal interconnection specimen could be prepared as shown in FIG. 3A. Seven metal interconnection specimens were prepared under the same conditions.

Figure 6A:
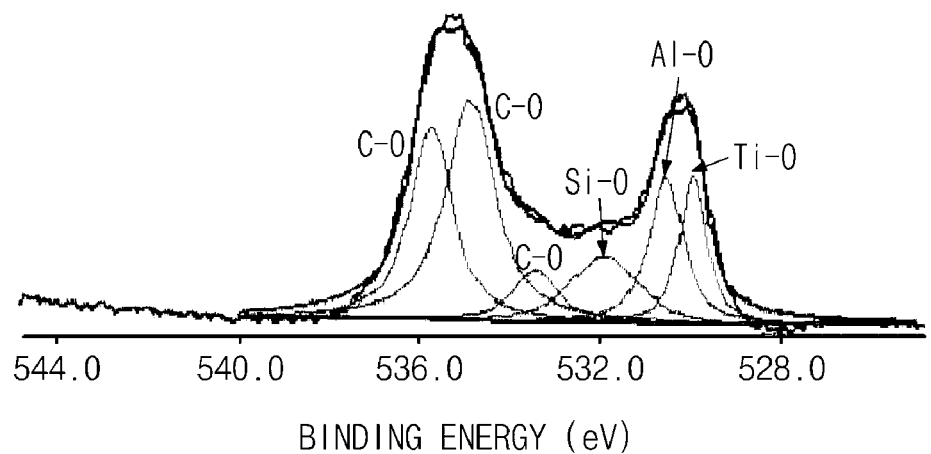
FIG. 6A illustrates a result of XPS Narrow scan prior to treatment with a photosensitive-resin remover composition according to an embodiment of the inventive concept.

FIG. 3A is an electron microscope photograph of a metal interconnection where an etching process is completed prior to treatment with a photosensitive-resin remover composition according to an embodiment of the inventive concept. As illustrated in FIG. 3A, a substantial amount of byproducts is attached to the side-wall and upper-portion of the metal interconnection. The XPS Narrow scan results illustrated in FIG. 6A demonstrate large quantities of aluminum-oxide or carbon-oxide in the byproducts.

4. Preparation of Via Hole Pattern Specimens

Figure 3B:
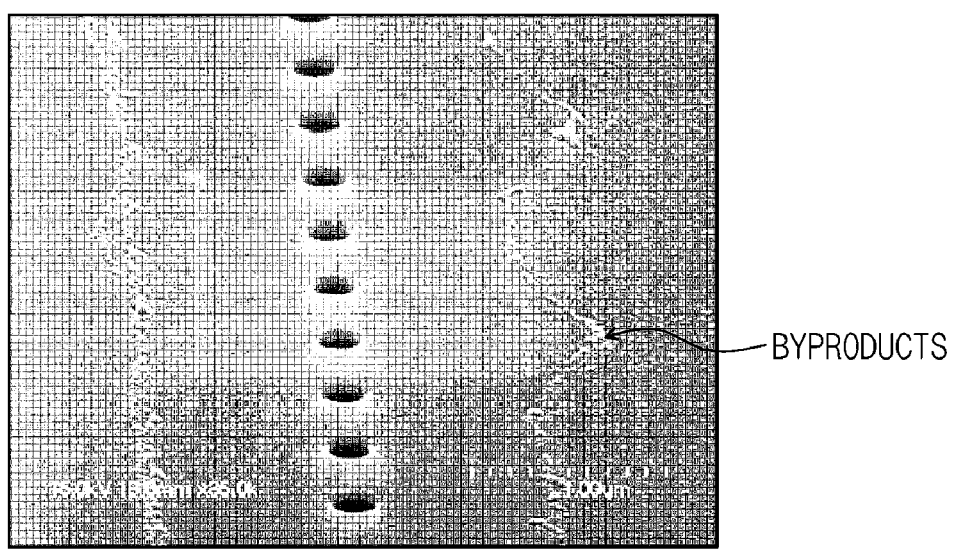
FIG. 3B illustrates an electron microscope photograph of etched via holes prior to treatment with a photosensitive-resin remover composition according to an embodiment of the inventive concept.

As described by referring to FIG. 2A, a metal interconnection including Ti/TiN 150 Å/Al 8000 Å/TiN 100 Å was formed on the silicon wafer. A silicon oxide layer was formed and a conventional photolithography process was performed to form a photo-resist pattern which defines via holes. As described by referring to FIG. 2B, a mixture gas of $CF_4/O_2$ was used as an etching gas and a silicon oxide layer which was not covered with the photo-resist pattern was etched to form via holes. Subsequently, as described by referring to FIG. 2C, a mixture gas of $O_2/N_2$ was used to perform an ashing process and via hole specimens could be prepared as shown in FIG. 3B. Seven via hole specimens were prepared under the same conditions.

FIG. 3B is an electron microscope photograph of via holes where an etching process is completed prior to treatment with a photosensitive-resin remover composition according to an embodiment of the inventive concept. As illustrated in FIG. 3B, etching byproducts are present as a residue around the via holes.

5. Preparation of Metal Pad Specimens

As described by referring to FIG. 1A, a silicon oxide layer was formed and deposited between the silicon wafer and a structure of Ti/TiN 150 Å/Al 20000 Å/TiN 100 Å. A photolithography process was performed to form a photo-resist pattern. As described by referring to FIG. 1B, a mixture gas of $CCl_4/O_2$ was supplied as an etching gas and a lower interconnection layer which was not covered with the photo-resist pattern was etched to form a metal interconnection. As described by referring to FIG. 1C, a mixture gas of oxygen/nitrogen was supplied as a reaction gas to perform an ashing process. In this way, a metal pad specimen could be prepared as shown in FIG. 3A. Seven metal pad specimens were prepared under the same conditions.

6. Application of Photosensitive-resin Remover Compositions

Solutions 1 to 7 having the compositions indicated in Tables 1 and 2 were applied to each identical metal interconnection specimen, metal pad specimen, and via hole specimen. That is, each metal interconnection specimen, metal pad specimen, and via hole specimen was dipped in each of the solutions 1 to 7. Solutions 1 to 5 applied to each metal interconnection specimen and via hole were maintained at about 45° C. for about 5 min and about 8 min, respectively. Solutions 1 to 5 applied to each metal pad specimen were maintained at about 60° C. for about 15 min. Solutions 6 and 7 applied to each metal pad specimen were maintained at about 70° C. for about 15 min. Subsequently, a washing process was performed with distilled water instead of isopropyl alcohol. The removal powers of the photo-resist patterns, corrosion degrees of the metal layers, and etching degrees of the oxide layers were identified and the results are shown in Table 3 below.

TABLE 3

| | | Photosensitive resin removal | | | | | |
|---|---|---|---|---|---|---|---|
| | | After ashing photo-resist (metal interconnection specimen) | | After ashing photo-resist (metal pad specimen) | | After ashing photo-resist (via hole specimen) | |
| Solution | Division | Photosensitive resin removal | Corrosion of metal layer | Photosensitive resin removal | Corrosion of metal layer | Photosensitive resin removal | Corrosion of metal layer |
| Solution 1 | Preparation Example 1 | ⊚ | ⊚ | ○ | ⊚ | ⊚ | ⊚ |
| Solution 2 | Preparation Example 2 | ⊚ | ⊚ | ○ | ⊚ | ⊚ | ⊚ |
| Solution 3 | Preparation Example 3 | ⊚ | ⊚ | Δ | ⊚ | ⊚ | ⊚ |
| Solution 4 | Preparation Example 4 | ⊚ | ⊚ | ⊚ | ⊚ | ⊚ | ⊚ |
| Solution 5 | Preparation Example 5 | ⊚ | ⊚ | Δ | ⊚ | ⊚ | ⊚ |
| Solution 6 | Comparative Example 1 | X | X | X | — | X | ⊚ |
| Solution 7 | Comparative Example 2 | X | X | Δ | ○ | X | ⊚ |

PR Removal- (Complete removal: ⊚, Removal: ○, Fair: Δ, Bad: X)
Lower metal layer corrosion- (No corrosion: ⊚, Pit some: ○, Pit severe: Δ, Corrosion severe: X)
Oxide layer etching (No etching: ⊚, Some etching: ○, Etching severe: X)
—: Lower metal layer not exposed because PR is not removed Referring to Table 3, it was found that when specimen were treated with a photosensitive-resin remover composition according to the inventive concept, i.e., solutions 1-5, photosensitive resin present on the surface of the specimen was cleanly removed without any corrosion of metal layer and/or any etching of oxide layer. In Table 3, Solution 4 particularly exhibited good results, where butyl diglycol, i.e., a relatively less toxic to the environment solvent, was used as an organic solvent. In solutions 1, 2, and 4, hydrazine hydrate was used as an amine compound, which may attack hardened and degenerated photosensitive resin and byproducts thereof twice or more to facilitate water dissolution. It is further noted that catechol, i.e., an environmentally regulated material, was not used in solutions 1-5 according to embodiments of the inventive concept, thereby minimizing toxicity in the environment.

Figure 4A:
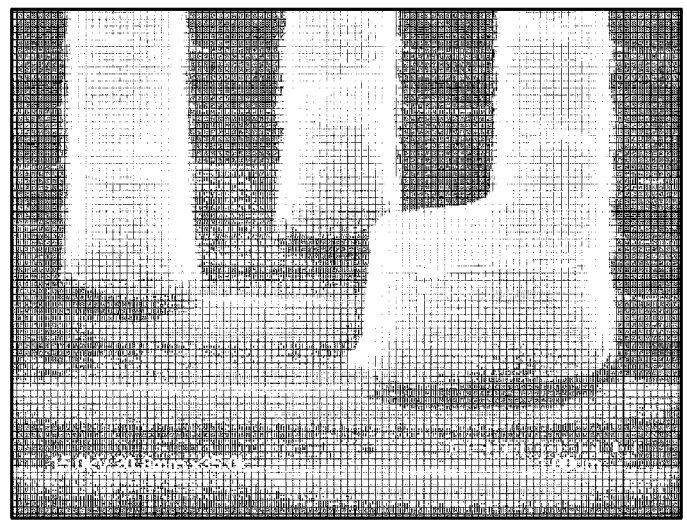
FIG. 4A illustrates an electron microscope photograph of metal patterns after photosensitive resin patterns are removed therefrom by using a photosensitive-resin remover composition prepared in Experimental Example 5 of an embodiment of the inventive concept.
Figure 4B:
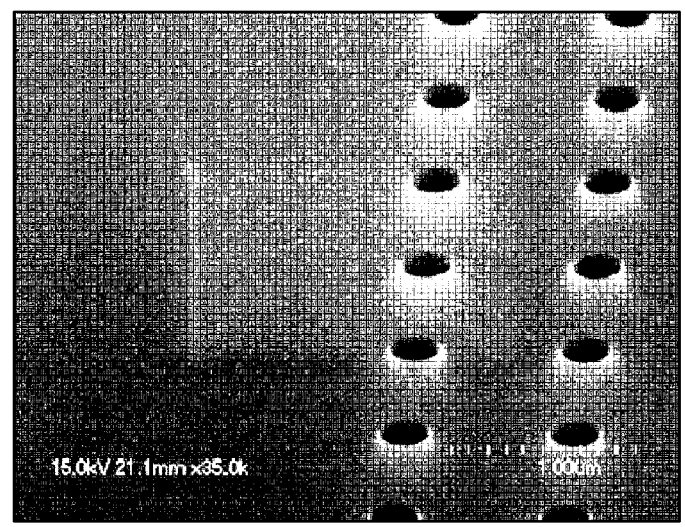
FIG. 4B illustrates an electron microscope photograph of via holes after photosensitive resin patterns are removed therefrom by using a photosensitive-resin remover composition prepared in Experimental Example 5 of an embodiment of the inventive concept.

FIG. 4A illustrates an electron microscope photograph of metal patterns after removal of photosensitive resin patterns by using a photosensitive-resin remover composition according to an embodiment, i.e., solution 5. FIG. 4B illustrates an electron microscope photograph of via holes after removal of photosensitive resin patterns by using a photosensitive-resin remover composition, i.e., solution 5, of an embodiment of the inventive concept. Referring to FIGS. 4A and 4B, it could be confirmed that the photo-resist pattern and byproducts were cleanly removed as compared to respective FIGS. 3A and 3B.

Figure 5:
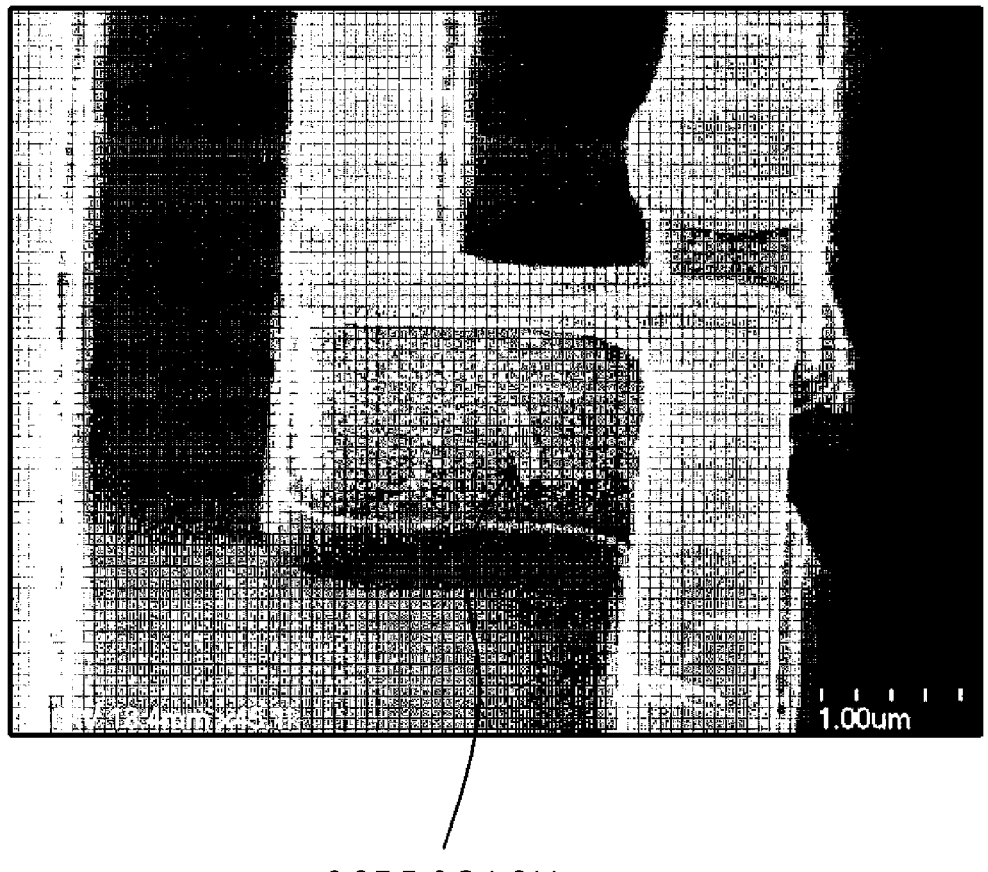
FIG. 5 illustrates an electron microscope photograph of metal patterns after photosensitive resin patterns are removed therefrom by using a photosensitive-resin remover composition prepared in a Comparative Example.

FIG. 5 illustrates an electron microscope photograph of metal patterns after removal of photosensitive resin patterns using a conventional photosensitive-resin remover, i.e., solution 6. Referring to FIG. 5, corrosion was generated on the surface of the aluminum layer.

Figure 6B:
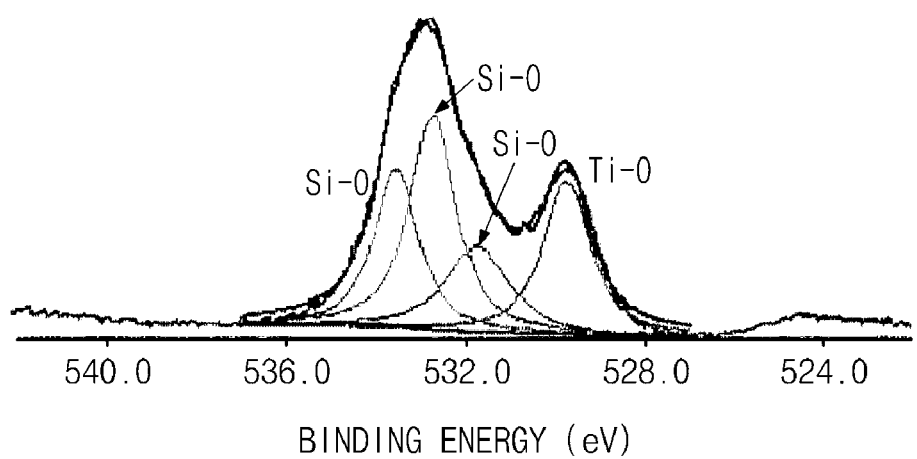
FIG. 6B illustrates a result of XPS Narrow scan after photosensitive resin patterns are removed from metal patterns by using a photosensitive-resin remover composition prepared in Experimental Example 5 of an embodiment of the inventive concept.

FIG. 6B illustrates a result of XPS Narrow scan after photosensitive resin patterns are removed from metal patterns by using a photosensitive-resin remover composition of an embodiment of the inventive concept, i.e., solution 5. Referring to FIG. 6B, aluminum-oxide or carbon-oxide were not present as compared to FIG. 6A.

In this way, a photosensitive-resin remover composition according to the inventive concept may remove a hardened or degenerated photosensitive resin effectively within a short time. Further, a photosensitive-resin remover composition according to the inventive concept may also minimize any corrosion against metal. Also, the re-attachment of the removed photosensitive resin may not be generated. Thus, a method of fabricating a semiconductor device, which is reliable and may enhance the productivity, may be provided.

The content of water in a photosensitive-resin remover composition according to an embodiment of the inventive concept may be about 45% to about 99% by weight, and when the photo-resist is removed by using the same, a hardened or degenerated photo-resist and byproducts thereof may be cleanly removed. Therefore, it may be possible to use only water without isopropyl alcohol in the subsequent washing process. In this way, an overall process may be simplified.

Because a photosensitive-resin remover composition according to the inventive concept has a high content of water and a low viscosity (having a viscosity of about 1 to about 2 centipoises), it may be applied to a batch-type process as well as a single wafer process. In this way, a method for fabricating semiconductor device, which is reliable and may enhance the productivity, may be provided.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

The invention claimed is:

1. A photosensitive-resin remover composition, consisting essentially of:
    an amine compound selected from hydrazine hydrate, methyl amine and diethyl amine;
    a removing accelerator in an amount of about 0.01% to about 10% by weight based on a total weight of the composition, wherein the removing accelerator is selected from methyl gallate, 1,2,3-benzenetriol and 1,3,5-benzenetriol; and
    de-ionized water, an amount of the de-ionized water being about 45% to about 99% by weight based on a total weight of the composition,
    wherein the photosensitive-resin remover composition has a viscosity of about 1 to about 2 centipoise.

2. The photosensitive-resin remover composition consisting essentially of:
    an amine compound selected from hydrazine hydrate, methyl amine and diethyl amine;
    a removing accelerator in an amount of about 0.01% to about 10% by weight based on a total weight of the composition, wherein the removing accelerator is selected from methyl gallate, 1,2,3-benzenetriol and 1,3,5-benzenetriol;
    de-ionized water, an amount of the de-ionized water being about 45% to about 99% by weight based on a total weight of the composition,
    a corrosion inhibitor, the corrosion inhibitor including at least one of an aromatic mercapto compound, a triazole compound, an ammonium salt, and/or a polysaccharide,
    wherein the photosensitive-resin remover composition has a viscosity of about 1 to about 2 centipoises.

3. A photosensitive-resin remover composition, consisting essentially of:
    hydrazine hydrate in an amount of about 1% to about 3% by weight;
    a removing accelerator in an amount of about 1% to about 3% by weight, based on a total weight of the composition, wherein the removing accelerator is selected from methyl gallate, 1,2,3-benzenetriol and 1,3,5-benzenetriol;
    butyl diglycol in an amount of about 10% to about 40% by weight; and
    de-ionized water in an amount of about 70% to about 88% by weight,
    wherein the photosensitive-resin remover composition has a viscosity of about 1 to about 2 centipoises.

* * * * *